(12) United States Patent
Riho

(10) Patent No.: US 8,938,570 B2
(45) Date of Patent: Jan. 20, 2015

(54) SEMICONDUCTOR DEVICE AND METHOD OF MANUFACTURING THE SAME

(71) Applicant: PS4 Luxco S.a.r.l., Luxembourg (LU)

(72) Inventor: Yoshiro Riho, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/330,223

(22) Filed: Jul. 14, 2014

(65) Prior Publication Data

US 2014/0321223 A1    Oct. 30, 2014

Related U.S. Application Data

(63) Continuation of application No. 13/311,392, filed on Dec. 5, 2011, now Pat. No. 8,788,738.

(30) Foreign Application Priority Data

Dec. 8, 2010   (JP) ................................. 2010-273230

(51) Int. Cl.
*G06F 3/06* (2006.01)
*G11C 7/10* (2006.01)
*G06F 13/00* (2006.01)

(52) U.S. Cl.
CPC ....................................... *G11C 7/10* (2013.01)
USPC .......... 710/316; 710/2; 710/5; 710/8; 710/11; 710/15

(58) Field of Classification Search
None
See application file for complete search history.

(56) References Cited

U.S. PATENT DOCUMENTS

| 2005/0102477 | A1  | 5/2005  | Sukegawa |
|---|---|---|---|
| 2007/0126105 | A1  | 6/2007  | Yamada et al. |
| 2007/0271409 | A1  | 11/2007 | Miura et al. |
| 2009/0039340 | A1* | 2/2009  | Toda ............................... 257/21 |
| 2010/0023665 | A1  | 1/2010  | Horikawa et al. |

FOREIGN PATENT DOCUMENTS

| JP | H10-40206 A   | 2/1998 |
|---|---|---|
| JP | 2007-157266 A | 6/2007 |
| JP | 2007-310430 A | 11/2007 |

\* cited by examiner

*Primary Examiner* — Scott Sun
(74) *Attorney, Agent, or Firm* — McGinn IP Law Group, PLLC

(57) ABSTRACT

A semiconductor device includes a controller chip, a plurality of semiconductor chips operatively connected to the controller chip, wherein at least one of the plurality of semiconductor chips is operatively supplied with a pulse signal from the controller chip, and operatively supplied identification information, wherein each of the plurality of semiconductor chips is configured to store the identification information in response to the pulse signal received from the controller chip, and wherein each of the plurality of semiconductor chips is configured to block transmission of the pulse signal to a following semiconductor chip in a signal path among the plurality of semiconductor chips until identification information is stored therein.

20 Claims, 11 Drawing Sheets

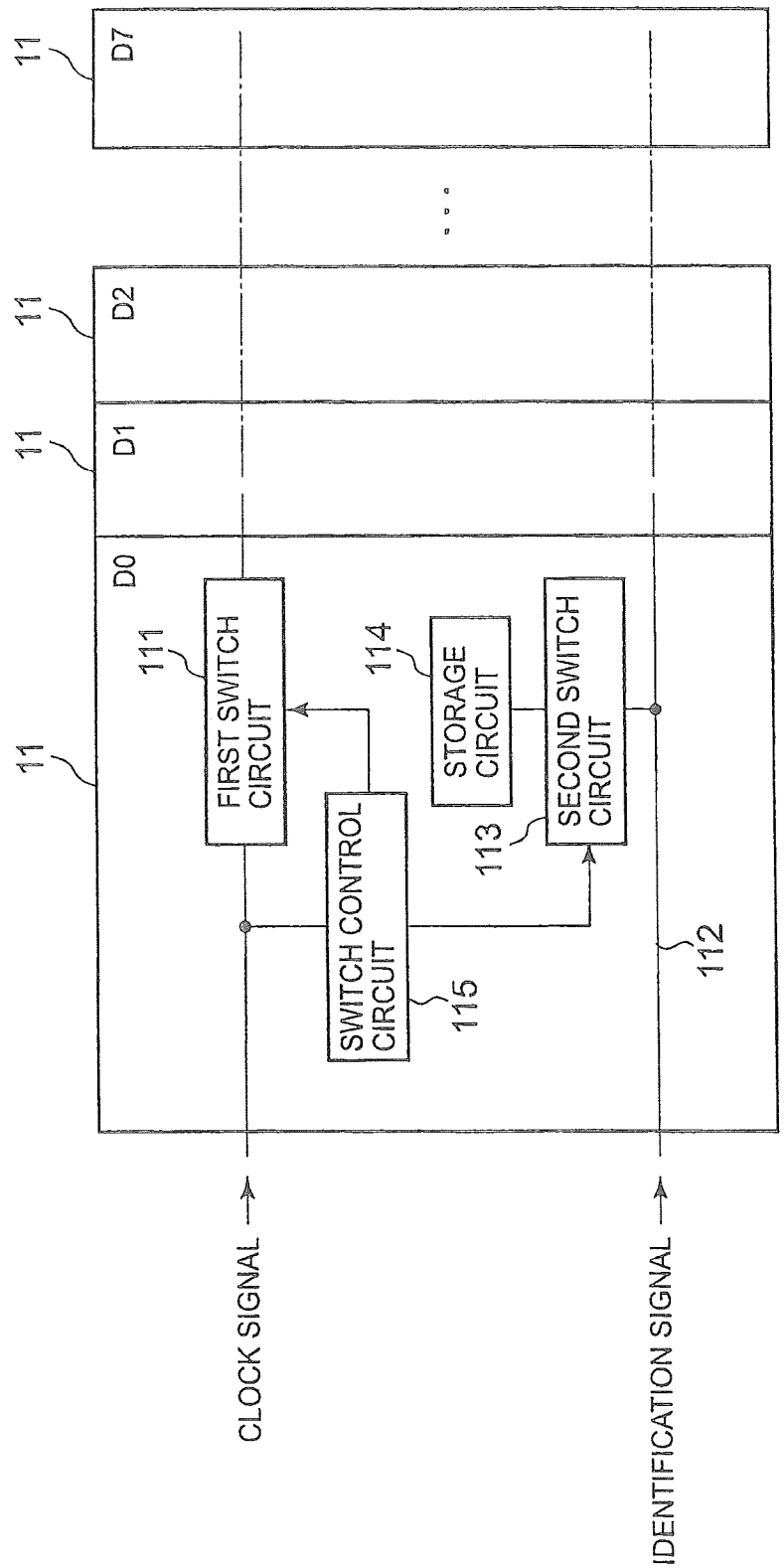

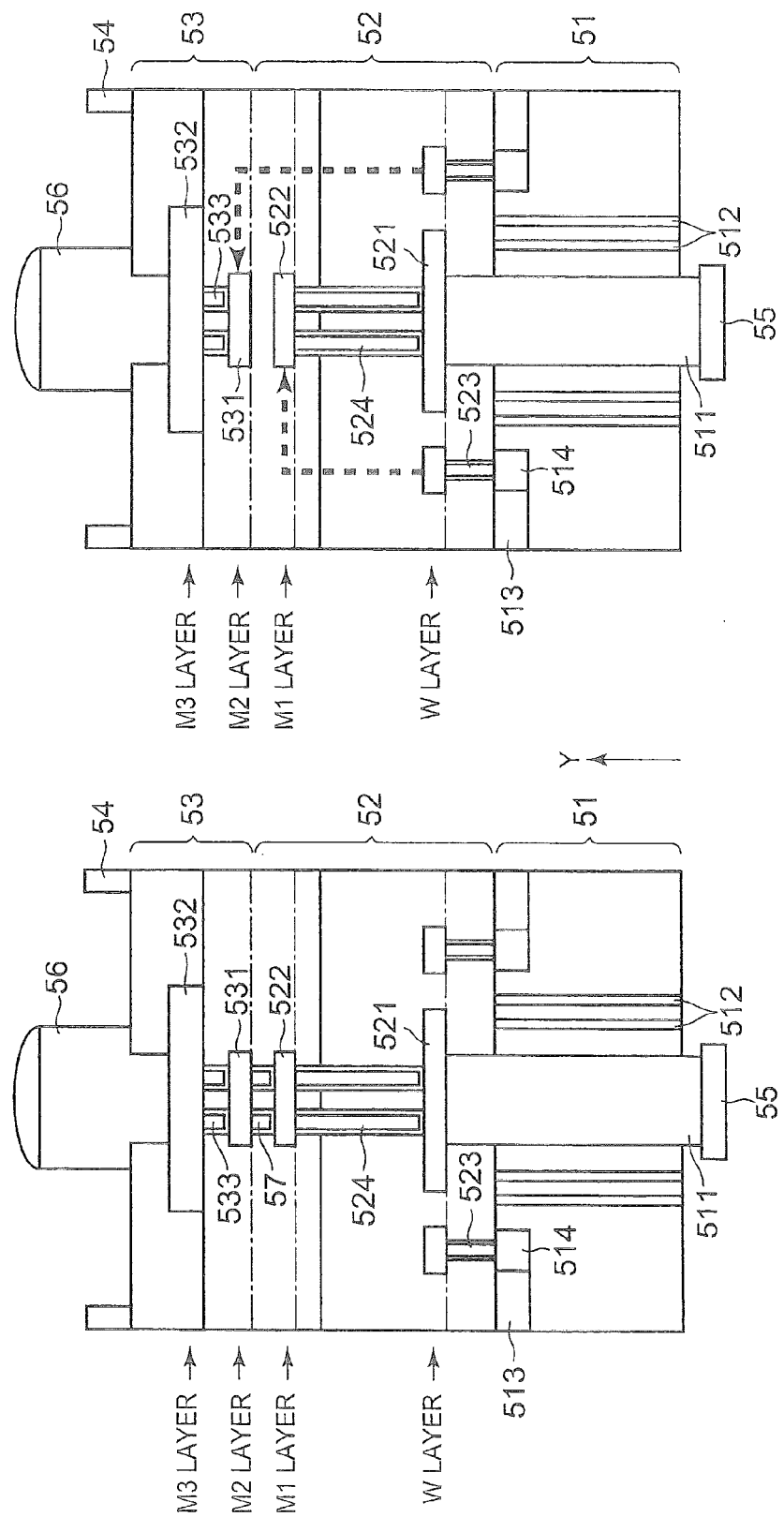

US 8,938,570 B2

SEMICONDUCTOR DEVICE AND METHOD OF MANUFACTURING THE SAME

The present application is a Continuation Application of U.S. patent application Ser. No. 13/311,392, filed on Dec. 5, 2011, which is based on and claims priority from Japanese Patent Application No. 2010-273230, filed on Dec. 8, 2010, the entire contents of which is incorporated herein by reference.

BACKGROUND OF THE INVENTION

1. Field of the Invention

The present invention relates to a semiconductor device and a method of manufacturing the same, and more particularly to a semiconductor device having a plurality of semiconductor chips and a method of manufacturing the same.

2. Description of the Related Art

In a semiconductor device having a plurality of semiconductor chips, a unique identification number should be assigned to each of the semiconductor chips to identify individual semiconductor chips. This holds true for a multilayered semiconductor device having a plurality of semiconductor memory chips stacked thereon.

In a related multilayered semiconductor device, an arithmetic circuit is provided on each of stacked semiconductor chips. An output of a lower-layer arithmetic circuit is used as an input to an upper-layer arithmetic circuit. Thus, each of the semiconductor chips is configured to generate a unique identification number. See, e.g., US 2007/0126105 A1 (JP-A 2007-157266:Patent document 1).

The present inventor has recognized that in the semiconductor device disclosed in Patent document 1, an arithmetic circuit is provided on each of the semiconductor chips and therefore, circuits relating to assignment of identification numbers are complicated and a large area is required for those circuits.

SUMMARY

In one embodiment, there is provided a semiconductor device including a controller chip, a plurality of semiconductor chips operatively connected to the controller chip, wherein at least one of the plurality of semiconductor chips are operatively supplied with a pulse signal from the controller chip, and operatively supplied identification information, wherein each of the plurality of semiconductor chips is configured to store the identification information in response to the pulse signal received from the controller chip, and wherein each of the plurality of semiconductor chips is configured to block transmission of the pulse signal to a following semiconductor chip in a signal path among the plurality of semiconductor chips until identification information is stored therein.

Each of the plurality of semiconductor chips includes a control circuit and a first switch, the control circuit being configured to turn the first switch in a conductive state after a semiconductor chip from among the plurality of semiconductor chips has stored the identification information to allow transmission of the pulse signal to the following semiconductor chip. Each of the plurality of semiconductor chips includes a second switch controlling a storage of the identification information and receiving the identification information, the control circuit turns the second switch to a non-conductive state after storing the identification information to allow transmission of the pulse signal to the following semiconductor chip.

Each of the plurality of semiconductor chips is supplied with the identification information in an identification information setting mode, and cooperates with the supplied identification information to serve in a data transfer mode. Each of the plurality of semiconductor chips being arranged such that each of the semiconductor chips is connected to a different one of the plurality of semiconductor chips, and wherein each of the plurality of semiconductor chips comprising a set of terminals operatively supplied with the identification information of the semiconductor chips are connected in common to each other. Each of the plurality of semiconductor chips includes a control circuit, a first switch, and a second switch, the control circuit controls the first and second switches between conductive and non-conductive states to block or allow transmission of the identification information depending on whether the identification information is stored in one of the plurality of semiconductor chips.

Each of the plurality of semiconductor chips includes a control circuit, and a plurality of switches, the control circuit controls the plurality of switches between conductive and non-conductive states to block or allow transmission of the identification information depending on whether the identification information is stored in one of the plurality of semiconductor chips. The identification information comprises a unique identification for a semiconductor chip from among the plurality of semiconductor chips. The plurality of semiconductor chips are stacked therein, and the plurality of semiconductor chips are stacked on the controller chip in a multilayer.

The identification information comprises unique identification information assignable to any one of a plurality of semiconductor chips by changing an identification signal stored in one of the plurality of semiconductor chips so as to indicate the unique identification information in synchronism with sequential transmission of a pulse signal comprising a clock signal to the plurality of semiconductor chips. The controller chip comprising an interface chip that outputs the pulse signal comprising a clock signal, and controls at least transmission of data between an external circuit and the plurality of semiconductor chips including identification information of each of the plurality of semiconductor chips, and wherein the plurality of semiconductor chips communicate with each other.

In another embodiment, there is provided a method including supplying at least one of a plurality of semiconductor chips with a pulse signal from a controller chip, supplying identification information to each of the plurality of semiconductor chips, storing on each of the plurality of semiconductor chips the identification information in response to the pulse signal received from the controller chip, and blocking transmission of the pulse signal from the at least one of the plurality of semiconductor chips to a following semiconductor chip in a signal path among the plurality of semiconductor chips until identification information is stored therein by the at least one of the plurality of semiconductor chips.

The plurality of semiconductor chips being stacked thereon, and the plurality of semiconductor chips being stacked on the controller chip. Each of the plurality of semiconductor chips includes a control circuit and a first switch, the control circuit being configured to turn the first switch in a conductive state after the at least one of the plurality of semiconductor chips has stored the identification information to allow transmission of the pulse signal to the following semiconductor chip. Each of the plurality of semiconductor chips includes a second switch controlling a storage of the identification information and receiving the identification information, the control circuit turns the second switch to a non-conductive state after the at least one of the plurality of semiconductor chips has stored the identification information to allow transmission of the pulse signal to the following semiconductor chip, and wherein each of the plurality of semiconductor chips is supplied with the identification information in an identification information setting mode, and cooperates with the supplied identification information to serve in a data transfer mode.

In still another embodiment, there is provided a semiconductor apparatus including a controller chip, a plurality of semiconductor chips are operatively coupled with the controller chip, each of the plurality of semiconductor chips, including a first terminal operatively supplied with a pulse signal, a second terminal, a set of third terminals operatively supplied with identification information, wherein each of the plurality of semiconductor chips are configured to store the identification information in response to the pulse signal, and wherein at least one of the plurality of semiconductor chips is configured to electrically disconnect the first terminal from the second terminal until the at least one of the plurality of semiconductor chips stores the identification information and electrically connect the first terminal to the second terminal after the at least one of the plurality of semiconductor chips has stored the identification information.

The at least one of the plurality of semiconductor chips is configured to block or allow transmission of the pulse signal to a second semiconductor chip from among the plurality of semiconductor chips according to whether identification information is stored in the least one of the plurality of semiconductor chips. Each of the plurality of semiconductor chips is configured to block transmission of the pulse signal to a following semiconductor chip in a signal path among the plurality of semiconductor chips until identification information is stored, and wherein the at least one of the plurality of semiconductor chips includes a control circuit and a first switch coupled between the first and second terminals, the control circuit being configured to turn the first switch to a conductive state after the storage unit has stored the identification information.

Each of the plurality of semiconductor chips includes a second switch coupled to the set of third terminals, the control circuit turns the second switch to a non-conductive state after the at least one of the plurality of semiconductor chips has stored the identification information, and wherein the set of third terminals is supplied with the identification information in an identification information setting mode, and the semiconductor apparatus further comprises a set of fourth terminals that cooperates with the set of third terminals to serve as data terminals in a data transfer mode. The plurality of semiconductor chips are arranged such that the second terminal of each of the semiconductor chips is connected to the first terminal of a different one of the semiconductor chips and the set of third terminals of the semiconductor chips are connected in common to each other.

BRIEF DESCRIPTION OF THE DRAWINGS

The above features and advantages of the present invention will be more apparent from the following description of certain preferred embodiments taken in conjunction with the accompanying drawings, in which FIG. 1 is a block diagram showing an embodiment of the present invention.

FIG. 5A is a vertical cross-sectional view explanatory of a specific example of a through electrode portion for an identification signal that is included in the semiconductor device shown in FIG. 2A.

FIG. 5B is a vertical cross-sectional view explanatory of a specific example of a through electrode portion for a clock signal that is included in the semiconductor device shown in FIG. 2A.

DESCRIPTION OF EXEMPLARY EMBODIMENTS

Figure 2B:
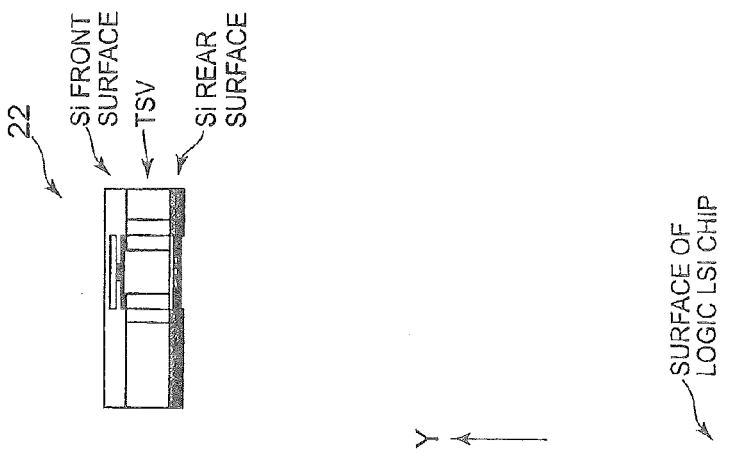
FIGS. 2A to 2B are vertical cross-sectional views showing a configuration example of a semiconductor device according to an embodiment of the present invention.

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

As shown in FIG. 1, a semiconductor device according to an embodiment of the present invention has a plurality of semiconductor chips 11 stacked with one another. In the illustrated embodiment, the semiconductor device has eight semiconductor chips D0-D7. Those semiconductor chips 11 have the same circuit configuration.

Each of the semiconductor chips 11 includes a first switch circuit 111 operable to transmit a clock signal inputted from the preceding chip to the following chip, a signal path 112 operable to transmit an identification signal inputted from the preceding chip to the following chip, a second switch circuit 113 operable to branch the identification signal from the signal path 112, a storage circuit 114 operable to store, as identification information, the identification signal branched by the second switch circuit 113, and a switch control circuit 115 operable to control the first switch circuit 111 and the second switch circuit 113 based upon the clock signal.

The switch control circuit 115 holds the first switch circuit 111 in a non-conduction state (off state) and the second switch circuit 113 in a conduction state (on state) until identification information is stored in the storage circuit 114. Furthermore, the switch control circuit 115 brings the first switch circuit 111 into a conduction state and the second switch circuit 113 into a non-conduction state after the identification information has been stored in the storage circuit 114.

With the above configuration, when each of the semiconductor chips 11 is supplied with a clock signal, it takes an identification signal from the signal path 112 via the second switch circuit 113 and stores identification information represented by the identification signal in the storage circuit 114. Each of the semiconductor chips 11 turns the first switch circuit 111 off to block transmission of the clock signal to the following semiconductor chips 11 until identification information is stored in the storage circuit 114 of the semiconductor chip 11. After identification information has been stored in the storage circuit 114, the semiconductor chip 11 turns the second switch circuit 113 off so as not to take an identification signal subsequently inputted. Therefore, unique identification information can be assigned to each of the semiconductor chips 11 by changing the identification signal so as to indicate unique identification information in synchronism with sequential transmission of the clock signal to the following semiconductor chips.

With the above configuration, no arithmetic circuit or the like need to be provided on each of the semiconductor chips 11. Therefore, it is possible to reduce the scale of circuits and an area required and further to reduce the cost of semiconductor devices.

It should be note that the clock signal (pulse signal) and the identification signal may be supplied to the chip D7 in place of D0. In this case, the input node of the switch control circuit 115 of each of the chips D0 to D7 is connected to the opposite side to the side of the first switch circuit 111 shown in FIG. 1.

Further embodiments of the present invention will be described below with reference to FIGS. 2A to 12.

Figure 2A:
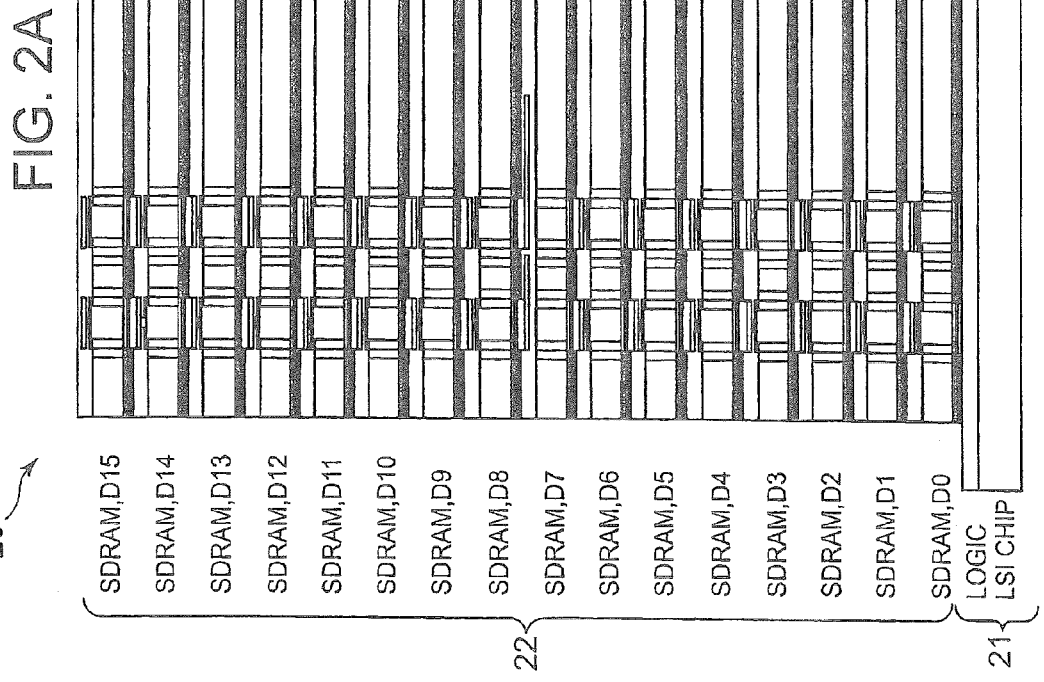

FIGS. 2A and 2B are diagrams showing a cross-sectional structure of a semiconductor device 20 according to an embodiment of the present invention. This semiconductor device 20 is a multilayered semiconductor device having a plurality of core chips stacked on an interface chip, which is called a chip-on-chip type. The illustrated example uses a logic large scale integration (LSI) chip 21 as an interface chip and synchronous dynamic random memory (SDRAM) chips 22 as core chips. The core chips are not limited to SDRAM chips and may be semiconductor chips having other circuits mounted thereon. Furthermore, the core chips may not have the same configuration or the same size. The number of the core chips being stacked is not limited to 16. Any number of core chips may be stacked. The interface chip may vary depending upon the configuration of the core chips. The size of the illustrated interface chip is larger than that of the core chips. Nevertheless, the size of the interface chip may be the same as or smaller than the size of the core chips.

The logic LSI chip 21 is mounted on a circuit board (not shown) such as a module board by using an interposer (not shown). The logic LSI chip 21 has a logic LSI circuit and controls at least transmission of data between an external circuit mounted on the circuit board and the SDRAM chips 22.

As shown in FIG. 2B, each of the SDRAM chips 22 has a silicon (Si) substrate, a circuit formed on a front face of the substrate, and a plurality of through silicon vias (TSVs) extending through the substrate. Each of the TSVs has an electrode formed on a Si front surface and an electrode formed on a Si rear surface. Through electrode portions, which include the TSVs, electrically connect between the logic LSI chip 21 and the SDRAM chips 22 and between the stacked SDRAM chips 22. A signal that is common to all of the SDRAM chips 22 can be supplied by a signal path formed straight along a stacking direction (along the Y-axis in FIGS. 2A and 2B) with the through electrode portions.

Figure 3:
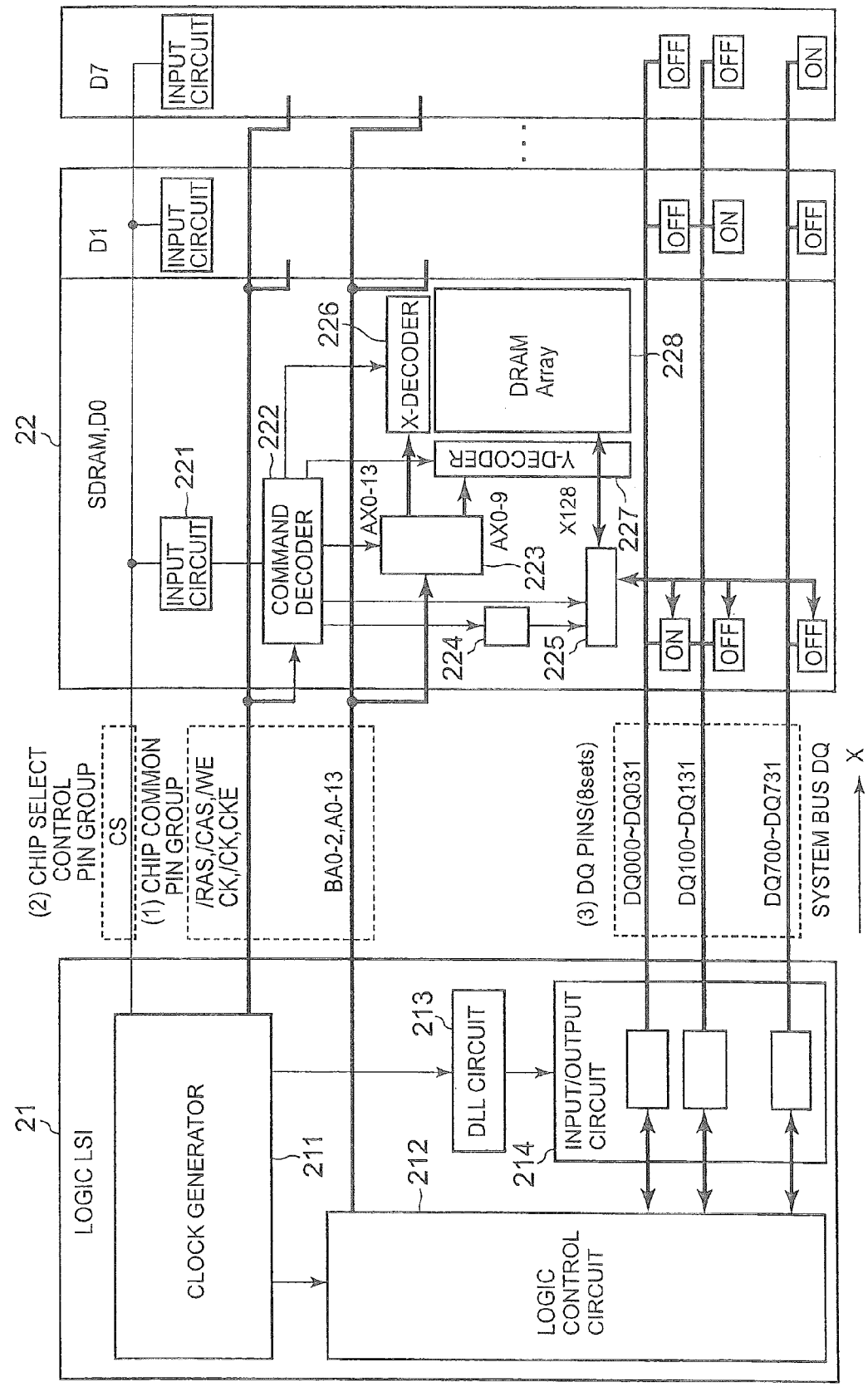
FIG. 3 is a block diagram explanatory of an internal configuration of the semiconductor device shown in FIG. 2A.

FIG. 3 illustrates an internal configuration of the semiconductor device 20. This example assumes a 1-Gigabyte DDR3 (double data rate) SDRAM system with an 8-bank configuration of eight stacked SDRAM chips 22 each having a memory capacity of 1 Gigabyte.

The logic LSI 21 includes at least a clock generator 211, a logic control circuit 212, a delay locked loop (DLL) circuit 213, and an input/output circuit 214.

The clock generator 211 outputs a chip select control signal (CS), clock signals (CK, /CK, and CKE), and command signals (/RAS, /CAS, and /WE) to the SDRAM chips 22. Furthermore, the clock generator 211 outputs a clock signal to the logic control circuit 212 and the DLL circuit 213.

The logic control circuit 212 outputs bank address signals (BA0-BA2) and address signals (A0-A13) to the SDRAM chips 22. Furthermore, the logic control circuit 212 transmits data to and receives data from the input/output circuit 214.

The input/output circuit 214 transmits data to and receives data from the eight SDRAM chips (D0-D7) 22. The data transmitted and received have (32 bits)×(8 sets)=256 bits. If the data transfer rate of the SDRAM chips 22 is 1,600 Mbps, it is possible to achieve data transfer at a speed of 1,600 Mbps×32×8=409.6 Gbit/sec=51.5 GB/sec.

Each of the SDRAM chips 22 has a predetermined number of external connection pins, which correspond to the TSVs. Specifically, each of the SDRAM chips 22 has 280 pins in total, which include 256 DQ (data) pins (DQ000-DQ031, . . . , DQ700-DQ731), 14 address pins (A0-A13), three bank address pins (BA0-BA2), three command pins (/RAS, /CAS, and /WE), and four clock pins (CS, CKE, CK, and /CK). Those pins can be categorized into three groups including a chip common pin group, a chip select control pin group, and a data pin group. In addition to the aforementioned pins, SDRAM chips have DM pins, DQS pins, ODT pins, and power source pins as is well known in the art. Those pins are omitted from the illustration.

The eight SDRAM chips 22 being stacked form linear signal paths along the stacking direction (along the X-axis in FIG. 3) through the through electrode portions. Those signal paths provide the shortest signal paths having substantially the same length.

Since the SDRAM chips 22 have the same configuration, the SDRAM chip (D0) 22 will be described representatively.

The SDRAM chip (D0) has an input circuit 221, a command decoder 222, an address buffer 223, a DLL circuit 224, a parallel-serial conversion and input/output circuit 225, an X-decoder 226, a Y-decoder 227, and a DRAM array 228.

The input circuit 221 outputs an output signal corresponding to the chip select control signal (CS) for selectively activating the SDRAM chips 22.

The command decoder 222 decodes the command signals (/RAS, /CAS, and /WE) and outputs the decoded commands to the address buffer 223, the X-decoder 226, and the Y-decoder 227. Furthermore, the command decoder 222 outputs the clock signals (CKE, CK, and /CK) to respective components.

The address buffer 223 is illustrated as including control logic and the like. The address buffer 223 outputs row addresses AX0-AX13 and column addresses AY0-AY9 to the X-decoder 226 and the Y-decoder 227, respectively, according to the command from the command decoder 222, and the bank address signals (BA0-BA2) and the address signals (A0-A13) from the logic LSI chip 21.

The DLL circuit 224 adjusts the timing of the clock signal and outputs the clock signal adjusted in timing.

The parallel-serial conversion and input/output circuit 225 performs a parallel-serial conversion of input/output data relating to the stored data. Furthermore, the parallel-serial conversion and input/output circuit 225 controls input and output of data for the DRAM array 228. The parallel-serial conversion and input/output circuit 225 is connected to one set of DQ pins (32 DQ pins) among the 256 DQ pins (system bus; 32 DQ pins×8 sets) via switches.

The X-decoder 226 and the Y-decoder 227 selectively activate a plurality of word lines and a plurality of bit lines in the DRAM array 228 according to the inputted row address and column address. Thus, the X-decoder 226 and the Y-decoder 227 write data in or read data from a corresponding memory cell of the DRAM array 228.

Since other portions of the aforementioned SDRAM chips 22 have been well-known in the art, operations of those portions are omitted from the following description.

In the semiconductor device 20 thus configured, unique identification information is assigned to each of the SDRAM chips 22 so as to identify the SDRAM chips 22. The assignment of the identification information is conducted sequentially on each stage from the SDRAM chip (D0) 22, which is close to the logic LSI chip 21, to the SDRAM chip (D7) 22. A configuration for achieving assignment of identification information will be described below with reference to FIG. 4.

Figure 4:
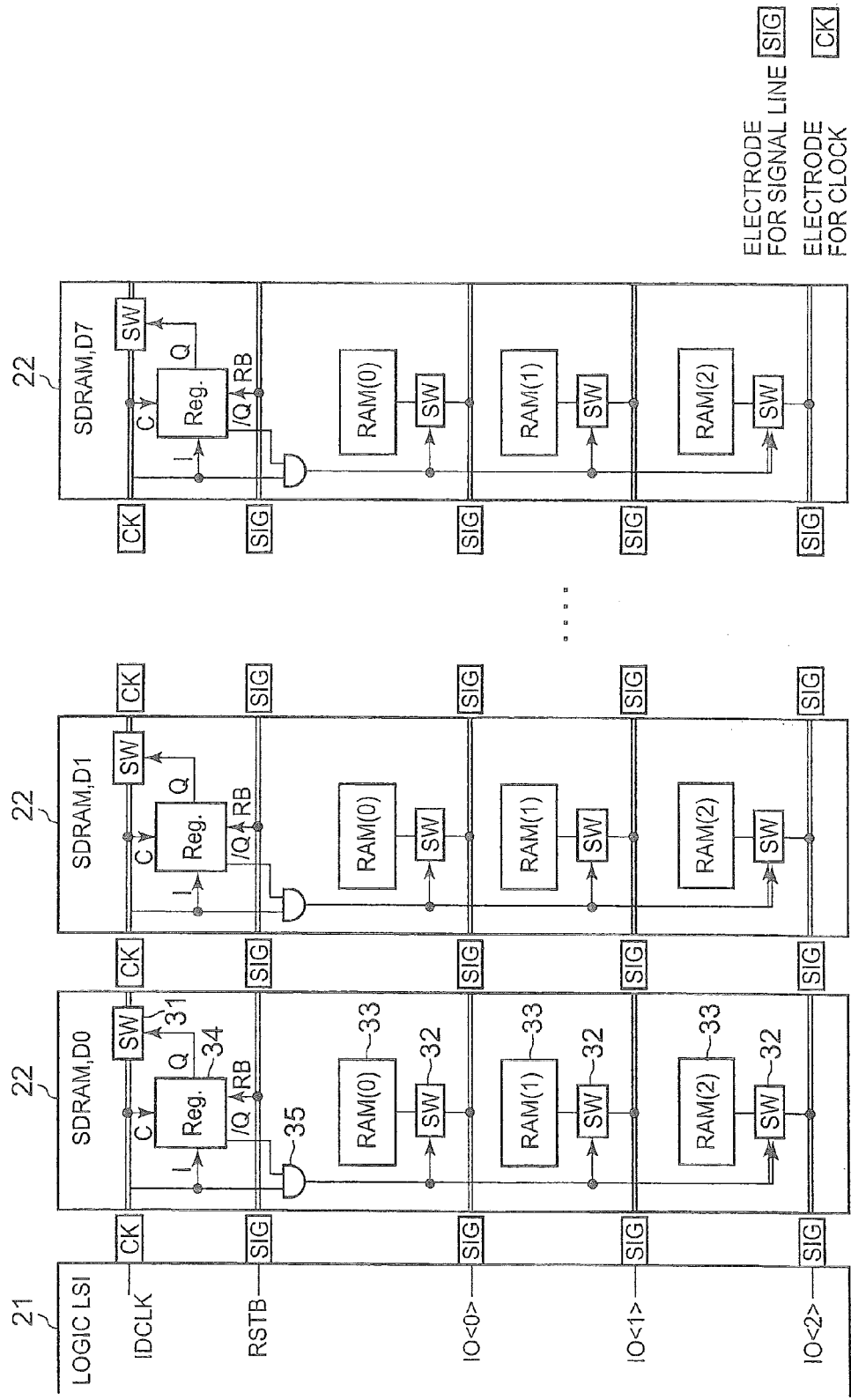
FIG. 4 is a configuration diagram explanatory of a portion relating to assignment of identification information in the semiconductor device shown in FIG. 2A.

Referring to FIG. 4, a clock signal IDCLK, a reset/set trigger bar signal RSTB, and identification number signals IO<0> to IO<2> are outputted from the logic LSI chip 21. The clock signal CK illustrated in FIG. 3 may be used for the clock signal IDCLK.

The eight SDRAM chips (D0-D7) 22 are stacked in the semiconductor device 20. Assignment of unique identification information to the eight SDRAM chips 22 needs 3-bit binary identification numbers (Chip IDs). Therefore, three identification number signals IO<0> to IO<2> are configured to respectively correspond to three bits of the identification numbers, and used as an identification signal. For example, the bank addresses BA0-BA2 illustrated in FIG. 3 may be used for those identification number signals.

The clock signal IDCLK and the reset/set trigger bar signal RSTB are used to control the eight SDRAM chips 22 so as to sequentially take the identification number signals. Any one of the command signals illustrated in FIG. 3 (e.g., /RAS) may be used for those signals.

Each of the SDRAM chips 22 has a first switch 31 provided so as to divide a signal path for transmitting the clock signal IDCLK to an adjacent SDRAM chip 22, a plurality of second switches 32 respectively connected to a plurality of signal paths for transmitting identification number signals IO to the adjacent SDRAM chip 22, a plurality of random access memories (RAMs) 33 respectively connected to the second switches 32, a register 34, and an AND circuit 35. In the illustrated example, each of the SDRAM chips 22 has three second switches 32. It should be noted that the RAMs 33 are different from the DRAM arrays 228 (FIG. 3).

When the number of the SDRAM chips 22 is $2^M$ where M is a natural number, the number of the signal paths for the identification number signals IO, the number of the second switches 32, and the number of the RAMs 33 are M.

The first switch 31 corresponds to the first switch circuit 111 of FIG. 1. The second switches 32 correspond to the second switch circuit 113 of FIG. 1. The RAMs 33 correspond to the storage circuit 114 of FIG. 1. The register 34 and the AND circuit 35 correspond to the switch control circuit 115 of FIG. 1.

FIGS. 5A and 5B are diagrams showing configurations of through electrode portions including TSVs. In other words, FIGS. 5A and 5B are partial cross-sectional views showing through electrode portions of the DRAM chip 22. In FIGS. 5A and 5B, transmission of signals between the stacked SDRAM chips 22 is achieved by linear signal paths that are formed along the stacking direction (the Y-axis in FIGS. 5A and 5B) with the through electrode portions including the TSVs.

FIG. 5A shows a through electrode portion for transmitting a signal inputted from a first surface (lower surface) of the SDRAM chip 22 directly to a second surface (upper surface) of the SDRAM chip 22. The first surface is provided with a rear bump 55 and located on an upstream side of the SDRAM chip 22. The second surface is provided with a front bump 56 and located on a downstream side of the SDRAM chip 22. This through electrode portion is used to transmit the identification number signals IO<0> to IO<2>.

FIG. 5B shows a through electrode portion for outputting a signal inputted from a first surface (lower surface) of the SDRAM chip 22 to a second surface (upper surface) of the SDRAM chip 22. The first surface is provided with a rear bump 55 and located on an upstream side of the SDRAM chip 22. The second surface is provided with a front bump 56 and located on a downstream side of the SDRAM chip 22. This through electrode portion is used to transmit the clock signal IDCLK.

The through electrode portion shown in FIG. 5A includes a Si substrate 51 having a circuit (internal circuit) formed on a surface thereof, a first wiring layer 52 and a second wiring layer 53 sequentially formed on the Si substrate 51, and a protective layer (polyimide film) 54. This through electrode portion has a rear bump (first electrode) 55 formed on a rear side (lower side in FIG. 5A) of the chip and a front bump (second electrode) 56 formed on a front side (upper side in FIG. 5A) of the chip.

The Si substrate 51 has a TSV 511 extending through the Si substrate 51 from one surface to another. Furthermore, TSV trenches 512 are formed around the TSV 511. The TSV trenches 512 electrically isolate the TSV 511 from an internal circuit formed around the TSV 511 or the like. The Si substrate 51 has a shallow trench isolation (STI) 513 and an impurity diffusion layer 514, which forms part of the internal circuit.

The first wiring layer 52 uses a multilayer structure having a plurality of wiring layers and interlayer dielectrics. In the illustrated example, the first wiring layer 52 includes two layers of a tungsten layer (W) and a first metal layer (M1). The first wiring layer 52 may include three or more wiring layers. Each of the wiring layers includes at least one wire (521, 522). One or more vias 523 and 524 connect between at least one wiring layer and the Si substrate 51 and between wires of different wiring layers as needed.

The second wiring layer 53 also uses a multilayer structure having a plurality of wiring layers and interlayer dielectrics. In the illustrated example, the second wiring layer 53 includes two layers of a second metal layer (M2) and a third metal layer (M3). The second wiring layer 53 may include three or more wiring layers. Each of the wiring layers includes at least one wire (531, 532). One or more vias 533 connect between wires of different wiring layers as needed.

In the through electrode portion shown in FIG. 5A, the wire 522 of the M1 layer and the wire 531 of the M2 layer are connected to each other by one or more vias 57. With this structure, the identification number signal IO inputted to the rear bump 55 is transmitted to the front bump 56 through the TSV 511, the wire 521, the via 524, the wire 522, the via 57, the wire 531, the via 533, and the wire 532. The TSV 511, the via 524, the via 57, the via 533, and the front bump 56 are arranged along substantially the same line (a straight line) in the cross-section. Thus, arrangement of the TSV 511, the via 524, the via 57, the via 533, and the front bump 56 with the wires 521, 522, 531, and 532 can form the shortest signal path. If the vias or the like overlap with the TSV 511 as seen downward or upward (from the front side or rear side of the Si substrate 51), they are deemed to be arranged along substantially the same line. In other words, "the same line" described in the specification has some width (size) depending upon the size of the TSV 511.

The structure of the through electrode portion shown in FIG. 5B is almost the same as that of the through electrode portion shown in FIG. 5A. However, the through electrode portion shown in FIG. 5B differs from the through electrode portion shown in FIG. 5A in that no via 57 is formed between the wire 522 of the M1 layer and the wire 531 of the M2 layer. The wire 522 of the M1 layer and the wire 531 of the M2 layer are connected to each other by the internal circuit formed on the Si substrate 51 (e.g., a transfer transistor or the first switch 31 (see FIG. 4)), wires included in the first wiring layer 52 and the second wiring layer 53, and vias. Specifically, an input node and an output node of an internal circuit (not shown) formed in the Si substrate 51 are connected to one of wires included in the first wiring layer 52 (a first node; e.g., the wire 522) and one of wires included in the second wiring layer 53 (a second node; e.g., the wire 533), respectively, as indicated by the dashed arrows. Thus, the first node and the second node are connected to each other by the internal circuit formed in the Si substrate 51.

Figure 6B:
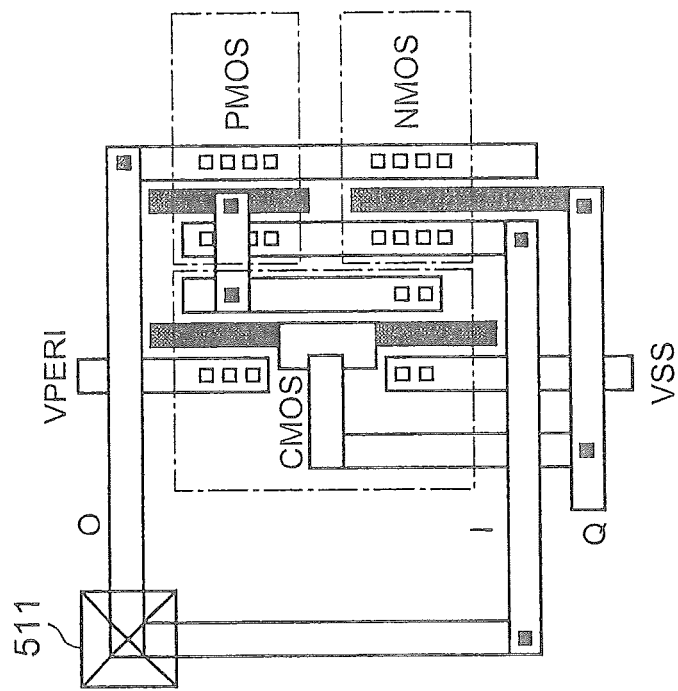
FIG. 6B is a plan view showing a wiring layout example of the circuit diagram shown in FIG. 6A.
Figure 6A:
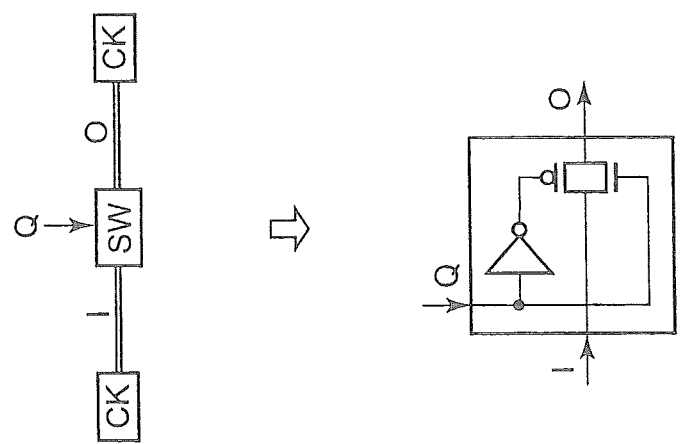
FIG. 6A is a circuit diagram showing an example of a circuit configuration of the through electrode portion shown in FIG. 5B.

FIG. 6A is a circuit diagram. FIG. 6B shows a pattern layout of the circuit diagram shown in FIG. 6A. The through electrode portion shown in FIG. 5A can be deemed to have a pair of electrodes (CKs) and a switch SW connected between the electrodes as illustrated in the upper figure of FIG. 6A. Assuming that the switch SW is a switch (transfer transistor) including a complementary metal oxide semiconductor (CMOS) inverter (a NOT circuit) and a pair of transistor switches (a p-channel metal oxide semiconductor (PMOS) and an n-channel metal oxide semiconductor (NMOS)) as illustrated in the lower figure of FIG. 6A, for example, the wires included in the first wiring layer 52 and the second wiring layer 53 can be arranged near the TSV 511 as shown in FIG. 6B. A further explanation will be provided with reference to FIG. 5B in addition to FIG. 6B.

In FIG. 6B, the CMOS inverter is connected between a power source line VPERI and a ground line VSS. A control signal Q is supplied in common to gates of a PMOS and an NMOS of the CMOS inverter. The control signal Q is also supplied to a gate of the NMOS of the pair of the transistor switches. The control signal Q is supplied from another internal circuit formed on the Si substrate (the register 34 (see FIG. 4)) and transmitted through the wire included in the first wiring layer 52.

An output of the CMOS inverter is supplied to a gate of the PMOS of the pair of the transistor switches. The output of the CMOS inverter is transmitted through the wire included in the first wiring layer 52.

An input signal I to the switch SW is provided to the rear bump 55 and supplied to one of nodes of the transistor switches (input node) through the TSV 511, the wire included in the first wiring layer 52, and the vias. When a portion of the wire in the first wiring layer 52 is formed as a first node on a line connecting between the TSV 511 and the front bump 56, the TSV 511 constitutes a first wire connecting the first electrode (55) and the first node to each other. Furthermore, the first wiring layer 52 includes a second wire connecting between an input node of the switch SW and the first node.

An output signal O of the switch SW is outputted from the other node of the transistor switches (output node) through the wire and the via included in the first wiring layer 52 and the wire and the via included in the second wiring layer 53 to the front bump 56. When a portion of the wire in the second wiring layer 53 is formed as a second node on a line connecting the TSV 511 and the front bump 56 to each other, the first wiring layer 52 and the second wiring layer 53 include a third wire connecting between an output node of the switch SW and the second node.

Thus, in the through electrode portion of FIG. 5B, the first node of the first wiring layer 52 and the second node of the second wiring layer 53, which are arranged on the same line connecting between the TSV 511 and the front bump 56, are connected to each other by the internal circuit (switch SW) formed in the Si substrate 51.

The first node may be formed in the W layer or the M1 layer of the first wiring layer 52. In the case where the first node is formed in the M1 layer, the first wire includes a via connecting between the W layer and the M1 layer. The first node may be defined in such a state that the W layer and the M1 layer of the first wiring layer 52 are formed into one layer. The second node may be formed in the M2 layer or the M3 layer of the second wiring layer 53. In the case where the second node is formed in the M2 layer, the M2 layer and the M3 layer are connected to each other by the via 533. The second node may be defined in such a state that the M2 layer and the M3 layer of the second wiring layer 53 are formed into one layer.

The third wire may not include a wiring layer included in the M1 layer. In other words, the third wire may include a via extending from the W layer to the M2 layer. Meanwhile, the W layer and the M2 layer may be connected to each other by a wiring layer (sixth wire) included in the M1 layer. In this case, the third wire includes a via connecting the sixth wire and the W layer to each other and a via connecting the sixth wire and the M2 layer to each other. Furthermore, the third wire may not include a wiring layer included in the M1 layer. For example, the W layer and the M3 layer may be connected to each other. Alternatively, the impurity diffusion layer 514, which forms part of the internal circuit, and the M3 layer may be connected to each other.

Next, an example of an internal configuration of the register 34 will be described below with reference to FIG. 7. The configuration of the register 34 is not limited to the illustrated one of FIG. 7.

Figure 7:
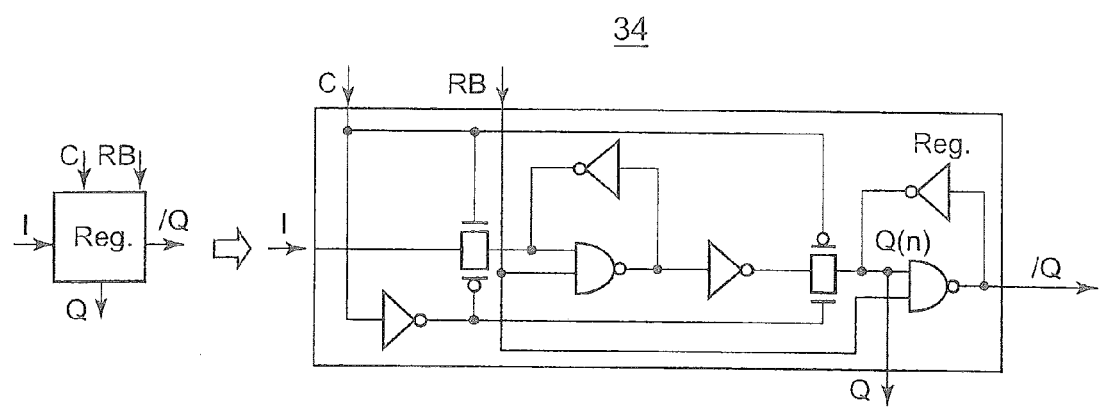
FIG. 7 is a circuit diagram showing an example of an internal configuration of a register included in the semiconductor device shown in FIG. 4.

As shown in FIG. 7, the register 34 may include a plurality of NOT circuits (inverters), a plurality of NAND circuits, and a plurality of transistor switches. This register 34 holds a logic level of an input signal I at a rising edge of an initial pulse of a clock signal C being inputted. At a falling edge of that pulse, the register 34 outputs an output signal Q having the logic level that has been held. It would be apparent to those skilled in the art that the register 34 can be configured to hold a logic level at a rising edge of an initial pulse of a clock signal C and output the held logic level at a falling edge of an Nth pulse following the initial pulse where N is a natural number. Specifically, the register 34 may be configured as a shift register having N shift stages.

Next, an example of internal configurations of the second switch 32 and the RAM 33 will be described below with reference to FIG. 8. The configurations of the second switch 32 and the RAM 33 are not limited to the illustrated ones of FIG. 8.

Figure 8:
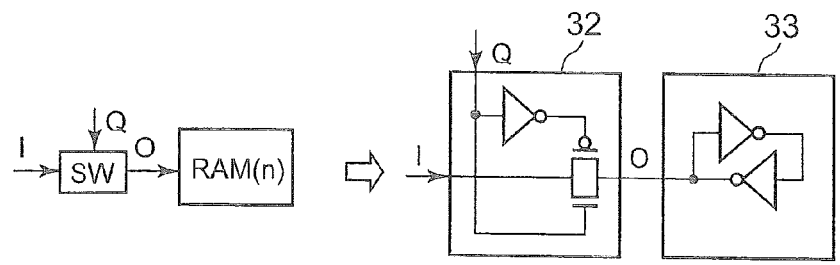
FIG. 8 is a circuit diagram showing an example of internal configurations of a second switch and a RAM included in the semiconductor device shown in FIG. 4.

As shown in FIG. 8, the second switch 32 may be configured in the same manner as the first switch 31 (see FIG. 6A). The RAM 33 may be configured by a pair of latch type inverters. In FIG. 8, the signal Q is an output signal of the AND circuit 35, and the signal I is one of the identification number signals IO<0> to IO<2>.

Referring back to FIG. 4, an assignment operation of identification information in the semiconductor device 20 will be described.

In the initial state, the output signal Q of the register 34 in each of the SDRAM chips 22 has one of two-valued logic levels (a low level in this example), and the first switch 31 is held in a non-conduction state (off state). Therefore, the clock signal IDCLK from the logic LSI chip 21 is supplied to the first-stage SDRAM chip (D0) 22 and is not transmitted to the second-stage and following core chips (D1-D7) 22.

The clock signal IDCLK is supplied as the clock signal C and the input signal I to the register 34 of the first-stage SDRAM chip (D0) 22. The clock signal IDCLK is also supplied to one of inputs of the AND circuit 35.

An inversed signal /Q of an output signal of the register 34 is supplied to the other input of the AND circuit 35. As described above, the output signal Q of the register 34 has a low level in the initial state. Therefore, the inversed output signal /Q has a high level. If the clock signal IDCLK is brought into a high level, the AND circuit 35 outputs a high level. As a result, the second switch 32 is brought into a conduction state (on state). At that time, logic levels of the identification number signals 10<0> to IO<2> from the logic LSI chip 21 are held in the corresponding RAMs (0-2) 33, respectively. Specifically, identification information (identification numbers) indicated by the identification number signals is written into the RAMs 33, which store the identification information therein.

Meanwhile, the register 34 holds a logic level of the input signal I when the clock signal C changes into a high level. The register 34 holds a high level at that time because the clock signal C and the input signal I are the same signal (IDCLK) as described above. When the clock signal C changes into a low level, the register 34 outputs the held logic level, i.e., a high level, as the output signal Q. Subsequently, the register 34 repeats the aforementioned operation and continues to output a high level as the output signal Q until the register 34 is reset.

When the output signal Q of the register 34 changes into a high level, the first switch 31 is brought into a conduction state. Thus, the clock signal IDCLK is supplied to the next SDRAM chip (D1).

Meanwhile, the inversed output signal /Q of the register 34 changes into a low level, so that the output of the AND circuit 35 changes into a low level. As a result, the second switch 32 is brought into a non-conduction state. Irrespective of subsequent changes of the identification number signals IO<0> to IO<2>, the RAMs 33 hold information taken at the time when the second switch 32 was in a conduction state.

In the second and following SDRAM chips 22, identification information is written into the RAMs 33 in the same manner as described above. The logic LSI chip 21 changes logic levels of the identification number signals IO at proper timing so as to write different identification information into the respective SDRAM chips 22. As a result, unique identification information is stored in the RAMs (0-2) 33 of all of the SDRAM chips 22.

Figure 9A:
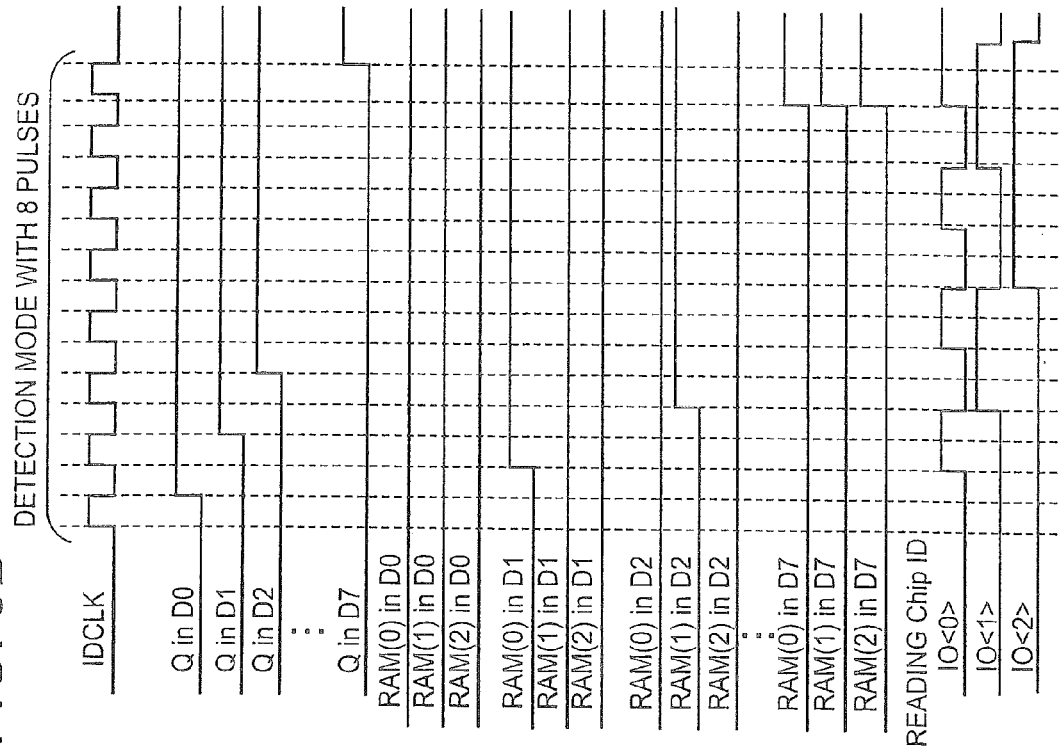
FIG. 9A is a waveform chart showing an example of signal waveforms at respective portions in a writing mode for explaining an operation of the semiconductor device shown in FIG. 4.

FIG. 9A shows signal waveform is in a case where identification information is written into the RAMs 33 of the respective SDRAM chips 22 (in a writing mode).

As can be seen from FIG. 9A, each of the SDRAM chips (D0-D7) 22 writes identification information (Chip ID) into the RAMs 33 according to the clock signal IDCLK and then changes the output signal Q of the register 34 into a high level. Thus, identification information is sequentially stored in each of chips from the preceding chip to the following chip.

Figure 9B:
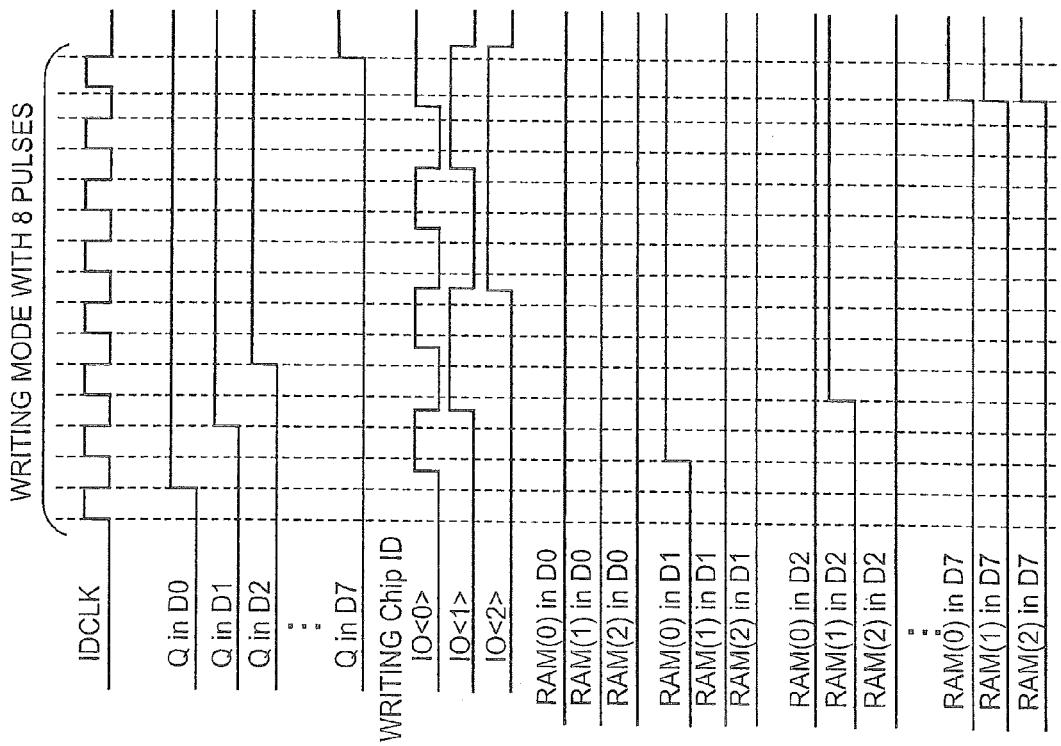
FIG. 9B is a waveform chart showing an example of signal waveforms at respective portions in a detection mode for explaining an operation of the semiconductor device shown in FIG. 4.

Detection of the identification information written in the RAMs 33 of the SDRAM chips can be conducted in the same manner as described above. FIG. 9B shows signal waveforms in a case where the identification information written in the RAMs 33 of the SDRAM chips 22 is detected (in a detection mode). As can be seen from FIG. 9B, the SDRAM chips (D0-D7) 22 store unique identification information.

The identification information written in the RAMs (0-2) 33 of the SDRAM chips 22 is used as follows.

Figure 10:
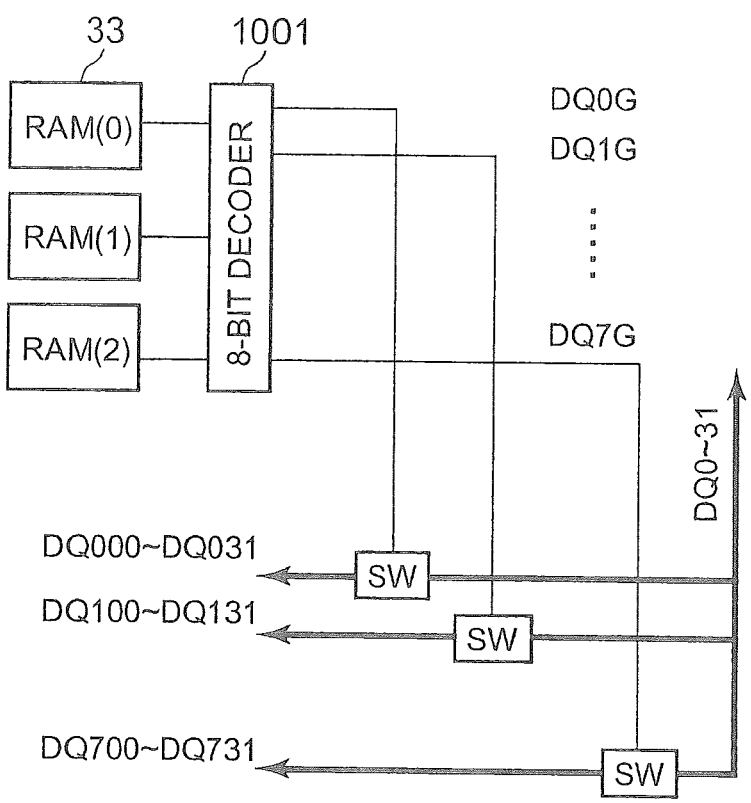
FIG. 10 is a block diagram showing an example of a chip built-in DQ decoder used in the semiconductor device shown in FIG. 4.

As described with reference to FIG. 3, the parallel-serial conversion and input/output circuit 225 in each of the SDRAM chips 22 is connected to one set of the DQ pins among eight sets of DQ pins (system bus) by the switches. The control of those switches are performed based upon the identification information written in the RAMs (0-2) 33. Specifically, an 8-bit decoder 1001 is provided as a chip built-in DQ decoder in each of the SDRAM chips 22 as shown in FIG. 10. The 8-bit decoder 1001 is connected to the RAMs (0-2) 33 so as to decode identification information read from the RAMS (0-2) 33. Eight sets of switches are controlled by decode signals from the 8-bit decoder 1001. In other words, one set of switches connected to one set of DQ pins among the eight sets of DQ pins are brought into a conduction state.

Next, a semiconductor device according to an embodiment of the present invention will be described below with reference to FIG. 11.

Figure 11:
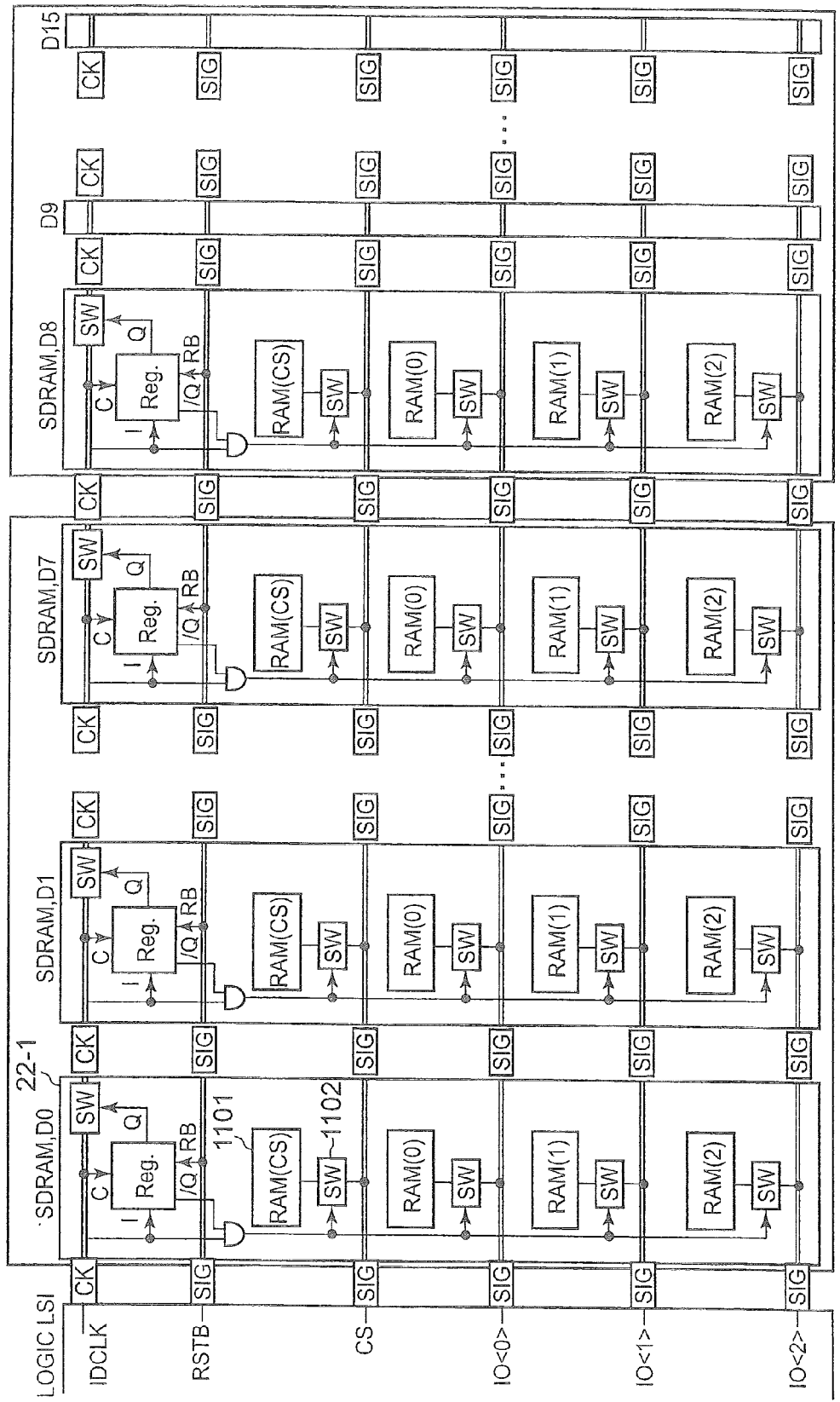
FIG. 11 is a configuration diagram showing a portion relating to assignment of identification information in a semiconductor device according to an embodiment of the present invention.
Figure 12:
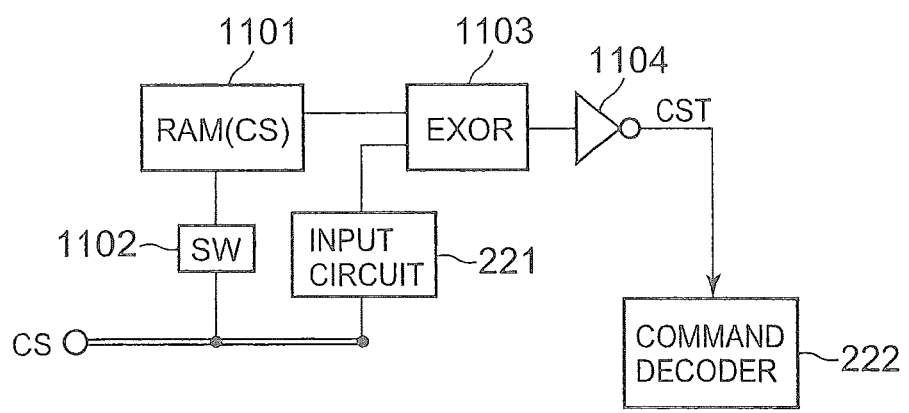
FIG. 12 is a block diagram showing an example of a chip built-in CS decoder used in the semiconductor device shown in FIG. 11.

The semiconductor device illustrated in FIG. 11 differs from the semiconductor device 20 illustrated in FIG. 2A in that each of SDRAM chips 22-1 has a RAM (CS) 1101 and a switch 1102, which correspond to a chip select control signal CS, and a chip built-in CS decoder shown in FIG. 12.

The semiconductor device illustrated in FIG. 11 uses a chip select control signal CS as a kind of identification signal. Specifically, the chip select control signal CS is used as an identification signal indicative of identification information in addition to the identification number signals IO. This simplifies circuit configurations as compared to use of 4-bit identification number signals. Thus, this semiconductor device can individually identify the SDRAM chips 22-1 even if the number of the stacked SDRAM chips 22-1 exceeds eight and becomes 16 (D0-D15). According to the embodiment, the number of the stacked SDRAM chips 22-1 is increased to 16 as compared to the embodiment. Thus, the storage capacity of the semiconductor device can be increased.

As shown in FIG. 12, the chip built-in CS decoder has an exclusive OR (EXOR) circuit 1103 and a NOT circuit 1104, which are connected between the input circuit 221 and the command decoder 222. The exclusive OR circuit 1103 outputs a low level when a signal read from the RAM 1101 coincides with an output signal of the input circuit 221. The NOT circuit 1104 inverses a logic level of an output signal of the exclusive OR circuit 1103. Thus, a chip select trigger CST is inputted into the command decoder 222 when the signal read from the RAM 1101 coincides with the output signal of the input circuit 221. The command decoder 222 outputs a command that reflects an input of the chip select trigger CST to the control logic included in the address buffer 223 (see FIG. 3).

The control logic controls the switches connected to the eight sets of DQ pins (system bus) based upon the command from the command decoder 222 and the output signal from the chip built-in DQ decoder (see FIG. 10). Different identification information can be assigned to the 16 SDRAM chips by the 16-pulse clock signal, the command select control signal CS, and the identification number signals IO<0> to IO<2>.

Although the present invention has been described along with some embodiments, the present invention is not limited to the above embodiments. It should be understood that various changes and modifications may be made therein without departing from the spirit of the present invention. For example, the technical concept of the present invention can be applied to a semiconductor device having a plurality of core chips stacked with one another, irrespective of whether or not the core chips are stacked. Furthermore, the circuit configurations in the circuit blocks and other circuits for generating control signals are illustrated merely by way of example. Therefore, the present invention is not limited to the circuit configurations illustrated in the above embodiments.

According to the present invention, unique identification information can be assigned to a plurality of semiconductor chips without use of an arithmetic circuit. Simplification of a circuit configuration, reduction of an area required, and cost reduction can be achieved.

The technical concept of the present invention relating to a semiconductor device can be applied to various kinds of semiconductor devices. For example, the present invention is applicable to semiconductor devices such as a central processing unit (CPU), a micro control unit (MCU), a digital signal processor (DSP), an application specific integrated circuit (ASIC), an application specific standard product (ASSP), and a memory. Examples of products using a semiconductor device according to the present invention include system-on-a-chip (SOC), multi-chip package (MCP), and package-on-package (POP). The present invention can be applied to a semiconductor device with any form or package of a product.

Transistors used may include a field effect transistor (FET). Various types of FETs including a metal oxide semiconductor (MOS), a metal-insulator semiconductor (MIS), and a thin film transistor (TFT) may be used for those transistors. Furthermore, a bipolar transistor may be provided in part of the semiconductor device.

Furthermore, an N-channel MOS transistor (NMOS transistor) is a typical example of a first conductive type of transistors, and a P-channel MOS transistor (PMOS transistor) is a typical example of a second conductive type of transistors.

The disclosed elements may be combined or selected in various ways within the scope of the appended claims of the present invention. In other words, the present invention includes a variety of variations and modifications that would be apparent to those skilled in the art from the entire disclosure and technical concept including the appended claims.

A through electrode portion used in the above embodiments can be described as in the following notes. Nevertheless, the present invention is not limited to those notes.

Note 1:

A semiconductor device comprising:

a chip having a substrate and a first layer and a second layer stacked on the substrate in order named;

a first electrode formed on a lower surface of the chip;

a second electrode formed on an upper surface of the chip;

a circuit having an input node and an output node formed on the substrate;

a first wire connecting the first electrode and a first node in the first layer to each other and extending through the substrate;

a second wire connecting the first node and the input node to each other, the first layer including the second node; and a third wire connecting the output node and a second node in the second layer to each other, the first layer and the second layer including the third wire, wherein the second node is connected to the second electrode, and the first electrode, the second electrode, and the first wire are arranged on the same line along a stacking direction of the chip.

Note 2:

The semiconductor device as recited in Note 1, wherein the first node and the second node are arranged on the same line as described above and electrically isolated from each other on the same line by an insulating layer between the first layer and the second layer.

Note 3:

The semiconductor device as recited in Note 1 or 2, wherein the first layer includes at least one first wiring layer, and the first wiring layer includes the first node and also includes a fourth wire, which is part of the first wire, the second wire, and the third wire.

Note 4:

The semiconductor device as recited in Note 3, wherein the first layer further includes a first via and a second via, the second wire and the input node are connected to each other by the first via, and the third wire and the output node are connected to each other by the second via.

Note 5:

The semiconductor device as recited in Note 4, wherein the first layer further includes a second wiring layer sandwiching the first wiring layer between the second wiring layer and the substrate, the second wiring layer includes the first node and also includes a fifth wire, which is part of the first wire, and a sixth wire, which is part of the third wire, the first layer further includes a third via, a fourth via, and a fifth via, the fourth wire and the fifth wire are connected to each other by the third via, the second wire and the fifth wire are connected to each other by the fourth via, and the third wire and the sixth wire are connected to each other by the fifth via.

Note 6:

The semiconductor device as recited in Note 1 or 2, wherein the second layer includes a third wiring layer, the third wiring layer includes the second node and also includes a seventh wire, which is part of the third wire, and the seventh wire is connected to the second electrode.

Note 7:

The semiconductor device as recited in Note 6, wherein the second layer further includes a sixth via and a fourth wiring layer sandwiching the third wiring layer between the fourth wiring layer and the second electrode, the fourth wiring layer includes the second node and also includes an eighth wire, which is part of the first wire, and the eighth wire is connected to the seventh wire by the sixth via.

Note 8:
The semiconductor device as recited in Note 7, wherein the second layer further includes a seventh via, and
the eighth wire is connected to the output node by the seventh via.

Note 9:
The semiconductor device as recited in Note 6, wherein the second layer further includes a seventh via,
the seventh wire is connected to the output node by the seventh via.

Note 10:
The semiconductor device as recited in Note 5, wherein the second layer includes a third wiring layer and a seventh via,
the third wiring layer includes the second node and also includes a seventh wire, which is part of the third wire, and
the seventh wire and the sixth wire are connected to each other by the seventh via.

Note 11:
The semiconductor device as recited in Note 5, wherein the second layer includes a third wiring layer,
the third wiring layer includes the second node and also includes a seventh wire, which is part of the third wire, and
the seventh wire is connected to the second electrode.

Note 12:
The semiconductor device as recited in Note 11, wherein the second layer further includes a sixth via and a fourth wiring layer sandwiching the third wiring layer between the fourth wiring layer and the second electrode,
the fourth wiring layer includes the second node and also includes an eighth wire, which is part of the first wire, and
the eighth wire is connected to the seventh wire by the sixth via.

Note 13:
The semiconductor device as recited in Note 12, wherein the second layer further includes a seventh via, and
the eighth wire and the sixth wire are connected to each other by the seventh via.

Note 14:
The semiconductor device as recited in any one of Notes 1 to 13, wherein the circuit includes a transistor, and
the input node and the output node are an input electrode and an output electrode of the transistor, respectively.

Note 15:
The semiconductor device as recited in Note 14, wherein the transistor is controlled by a control signal and is a transfer transistor for transferring, to the output node, an input signal supplied to the input node.

Note 16:
The semiconductor device as recited in any one of Notes 1 to 15, wherein the first, second, and third wires are a conductor made of metal.

What is claimed is:

1. A semiconductor device comprising:
a controller chip;
a plurality of semiconductor chips operatively connected to the controller chip;
wherein at least one of the plurality of semiconductor chips is operatively supplied with a pulse signal from the controller chip, and operatively supplied identification information,
wherein each of the plurality of semiconductor chips is configured to store the identification information in response to the pulse signal received from the controller chip, and
wherein each of the plurality of semiconductor chips is configured to block transmission of the pulse signal to a following semiconductor chip in a signal path among the plurality of semiconductor chips until identification information is stored therein.

2. The semiconductor device as claimed in claim 1, wherein each of the plurality of semiconductor chips includes a control circuit and a first switch, the control circuit being configured to turn the first switch in a conductive state after a semiconductor chip from among the plurality of semiconductor chips has stored the identification information to allow transmission of the pulse signal to the following semiconductor chip.

3. The semiconductor device as claimed in claim 2, wherein each of the plurality of semiconductor chips includes a second switch controlling a storage of the identification information and receiving the identification information, the control circuit turns the second switch to a non-conductive state after storing the identification information to allow transmission of the pulse signal to the following semiconductor chip.

4. The semiconductor device as claimed in claim 1, wherein each of the plurality of semiconductor chips is supplied with the identification information in an identification information setting mode, and cooperates with the supplied identification information to serve in a data transfer mode.

5. The semiconductor device as claimed in claim 1, wherein each of the plurality of semiconductor chips is arranged such that each of the semiconductor chips is connected to a different one of the plurality of semiconductor chips, and
wherein each of the plurality of semiconductor chips comprises a set of terminals operatively supplied with the identification information of the semiconductor chips are connected in common to each other.

6. The semiconductor device as claimed in claim 1, wherein each of the plurality of semiconductor chips includes a control circuit, a first switch, and a second switch, the control circuit controls the first and second switches between conductive and non-conductive states to block or allow transmission of the identification information depending on whether the identification information is stored in one of the plurality of semiconductor chips.

7. The semiconductor device as claimed in claim 1, wherein each of the plurality of semiconductor chips includes a control circuit, and a plurality of switches, the control circuit controls the plurality of switches between conductive and non-conductive states to block or allow transmission of the identification information depending on whether the identification information is stored in one of the plurality of semiconductor chips.

8. The semiconductor device as claimed in claim 1, wherein the identification information comprises a unique identification for a semiconductor chip from among the plurality of semiconductor chips.

9. The semiconductor device as claimed in claim 1, wherein the plurality of semiconductor chips are stacked therein, and the plurality of semiconductor chips are stacked on the controller chip in a multi-layer.

10. The semiconductor device as claimed in claim 1, wherein the identification information comprises unique identification information assignable to any one of a plurality of semiconductor chips by changing an identification signal stored in one of the plurality of semiconductor chips so as to indicate the unique identification information in synchronism with sequential transmission of a pulse signal comprising a clock signal to the plurality of semiconductor chips.

11. The semiconductor device as claimed in claim 1, wherein the controller chip comprises an interface chip that outputs the pulse signal comprising a clock signal, and controls at least transmission of data between an external circuit and the plurality of semiconductor chips including identification information of each of the plurality of semiconductor chips, and wherein the plurality of semiconductor chips communicate with each other.

12. A method comprising:

supplying at least one of a plurality of semiconductor chips with a pulse signal from a controller chip;

supplying identification information to each of the plurality of semiconductor chips;

storing on each of the plurality of semiconductor chips the identification information in response to the pulse signal received from the controller chip; and blocking transmission of the pulse signal from the at least one of the plurality of semiconductor chips to a following semiconductor chip in a signal path among the plurality of semiconductor chips until identification information is stored therein by the at least one of the plurality of semiconductor chips.

13. The method as claimed in claim 12, wherein the plurality of semiconductor chips are stacked thereon, and the plurality of semiconductor chips are stacked on the controller chip.

14. The method as claimed in claim 12, wherein each of the plurality of semiconductor chips includes a control circuit and a first switch, the control circuit being configured to turn the first switch in a conductive state after the at least one of the plurality of semiconductor chips has stored the identification information to allow transmission of the pulse signal to the following semiconductor chip.

15. The method as claimed in claim 14, wherein each of the plurality of semiconductor chips includes a second switch controlling a storage of the identification information and receiving the identification information, the control circuit turns the second switch to a non-conductive state after the at least one of the plurality of semiconductor chips has stored the identification information to allow transmission of the pulse signal to the following semiconductor chip, and wherein each of the plurality of semiconductor chips is supplied with the identification information in an identification information setting mode, and cooperates with the supplied identification information to serve in a data transfer mode.

16. A semiconductor apparatus comprising:

a controller chip;

a plurality of semiconductor chips operatively coupled with the controller chip, each of the plurality of semiconductor chips, comprising:

a first terminal operatively supplied with a pulse signal;

a second terminal;

a set of third terminals operatively supplied with identification information, wherein each of the plurality of semiconductor chips is configured to store the identification information in response to the pulse signal; and wherein at least one of the plurality of semiconductor chips is configured to electrically disconnect the first terminal from the second terminal until the at least one of the plurality of semiconductor chips stores the identification information and electrically connect the first terminal to the second terminal after the at least one of the plurality of semiconductor chips has stored the identification information.

17. The semiconductor apparatus as claimed in claim 16, wherein the at least one of the plurality of semiconductor chips is configured to block or allow transmission of the pulse signal to a second semiconductor chip from among the plurality of semiconductor chips according to whether identification information is stored in the least one of the plurality of semiconductor chips.

18. The semiconductor apparatus as claimed in claim 16, wherein each of the plurality of semiconductor chips is configured to block transmission of the pulse signal to a following semiconductor chip in a signal path among the plurality of semiconductor chips until identification information is stored, and wherein the at least one of the plurality of semiconductor chips includes a control circuit and a first switch coupled between the first and second terminals, the control circuit being configured to turn the first switch to a conductive state after the storage unit has stored the identification information.

19. The semiconductor apparatus as claimed in claim 18, wherein each of the plurality of semiconductor chips includes a second switch coupled to the set of third terminals, the control circuit turns the second switch to a non-conductive state after the at least one of the plurality of semiconductor chips has stored the identification information, and wherein the set of third terminals is supplied with the identification information in an identification information setting mode, and the semiconductor apparatus further comprises a set of fourth terminals that cooperates with the set of third terminals to serve as data terminals in a data transfer mode.

20. The semiconductor apparatus as claimed in claim 16, wherein the plurality of semiconductor chips are arranged such that the second terminal of each of the semiconductor chips is connected to the first terminal of a different one of the semiconductor chips and the set of third terminals of the semiconductor chips are connected in common to each other.

* * * * *